United States Patent [19]

Hardy

[11] 4,241,829
[45] Dec. 30, 1980

[54] MEANS FOR CONTAINING ELECTROSTATIC SENSITIVE ELECTRONIC COMPONENTS

[75] Inventor: Charles T. Hardy, Alsip, Ill.

[73] Assignee: Republic Packaging Company, Chicago, Ill.

[21] Appl. No.: 44,846

[22] Filed: Jun. 4, 1979

[51] Int. Cl.³ .................. B65D 81/00; B65D 81/04; B65D 85/30; B65D 65/42
[52] U.S. Cl. ................................. 206/328; 206/334; 206/591; 206/594; 206/523; 220/441; 220/453; 229/36; 361/212
[58] Field of Search ............... 206/334, 328, 332, 444, 206/523, 591, 594, 521; 361/212; 220/441, 453; 229/36, 33

[56] References Cited

U.S. PATENT DOCUMENTS

| | | | |
|---|---|---|---|
| 3,266,705 | 8/1966 | Wood | 206/523 |
| 3,344,973 | 10/1967 | Studen | 220/441 |
| 3,385,424 | 5/1968 | Thompson et al. | 229/36 |
| 4,038,693 | 7/1977 | Huffine et al. | 206/444 |
| 4,087,002 | 5/1978 | Bambara et al. | 206/523 |
| 4,156,751 | 5/1979 | Yenni, Jr. et al. | 206/332 |
| 4,160,503 | 7/1979 | Ohlbach | 206/334 |

*Primary Examiner*—William T. Dixson, Jr.

[57] ABSTRACT

A container for use with electrostatic sensitive electronic components comprises a box-like carton whose exterior and interior surfaces are coated with a material forming a substantially continuous conductive path. A liner of convoluted foam impregnated with a conductive material is secured to the interior surfaces of the lid and the bottom of the box-like carton, the impregnated conductive material forming a continuous conductive path with the conductive coating.

2 Claims, 2 Drawing Figures

MEANS FOR CONTAINING ELECTROSTATIC SENSITIVE ELECTRONIC COMPONENTS

BACKGROUND OF THE INVENTION

The present invention relates generally to containers for transporting fragile electronic components and, more particularly, to containers of the foregoing type which also serve to protect the components from damaging electrostatic influences.

Electronic components are typically transported from place to place in shipping containers specifically designed for protecting the fragile components from damaging shocks and the like. One known such container, see U.S. Pat. No. 3,273,779 to Mykleby, comprises a box-like carton having a hinged cover, the interior surfaces of the container's bottom and cover being lined with convoluted urethane foam. The urethane liners form a plurality of opposed and staggered foam fingers which firmly but gently hold or grip a component placed within the container when the cover is swung downwardly sandwiching the components between the opposed foam liners. Since the foam liners easily conform to the contours of the products placed within the container, economical packaging for irregularly shaped items and for multiple units is conveniently provided. Consequently, the need for elaborately constructed packages specially made to fit the particular shape of a product is largely eliminated.

While the above described shipping container, and other containers of similar construction, are suitable for use with certain product items, their suitability for use in transporting electrostatic sensitive electronic components is severely limited. More specifically, various electronic components such as metal oxide semiconductors (MOS), thick and thin film deposited products and others are highly sensitive to accumulations of electric charge, an excess accumulation of which may severely damage the the device. Precautions typically taken to minimize static electric discharges through the devices during transportation include the use of shorting rings to ground the leads of the device. Also, some devices or components are manufactured with built-in zener diodes to provide protection from low-energy sources.

Although the foregoing techniques are normally adequate to protect the transported components from harmful electrostatic influences, it is sometimes necessary to provide yet additional protection. Such additional protection frequently takes the form of a shipping enclosure commonly referred to as a Faraday cage. In its broadest sense, a Faraday cage may be defined as a system of conductors forming an essentially continuous conducting mesh or network about the object protected and including any conductors necessary for interconnection to the object protected and an adequate ground. In the past, the typical Faraday cage-type shipping enclosure has taken the form of an injection molded plastic container formed around a wire mesh screen in which the wire mesh screen forms an equipotential surface protecting the enclosed device from external electrostatic influences. In addition, the conductors forming the equipotential surface serve to dissipate any accumulation of electric charge built up on the enclosed devices by providing a conductive path between the devices and a source of ground potential.

The transportation container of the present invention differs from those previously proposed in the provision and construction of a Faraday cage type enclosure which, in addition to providing improved electrical performance when compared to similar prior art structures, is embodied in a form particularly suited for protecting the enclosed components from damage resulting from physically disturbing or stressing the container.

SUMMARY OF THE INVENTION

According to the present invention, there is provided a shipping or transportation container comprising a box-like structure having a bottom, a pair of opposed side walls, a pair of opposed end walls and a top moveable between an open and a closed position. A conductive coating is formed overlying substantially the entire interior and exterior surfaces of the box-like structure and includes a portion extending continuously therebetween. A line of convoluted foam impregnated with a conductive material is secured to the interior surfaces of the top and bottom of the container, the impregnated conductive material forming a continuous conductive path with the conductive coating. The container thereby forms a Faraday cage type enclosure providing increased protection from electrostatic influences by establishing a conductive shield of extremely high integrity, the convoluted foam liners promoting intimate contact between the conductive shield and the protected components. The foam liners additionally provide protection from physical damage by gently sandwiching the components therebetween.

DESCRIPTION OF THE PREFERRED EMBODIMENT

Figure 1:
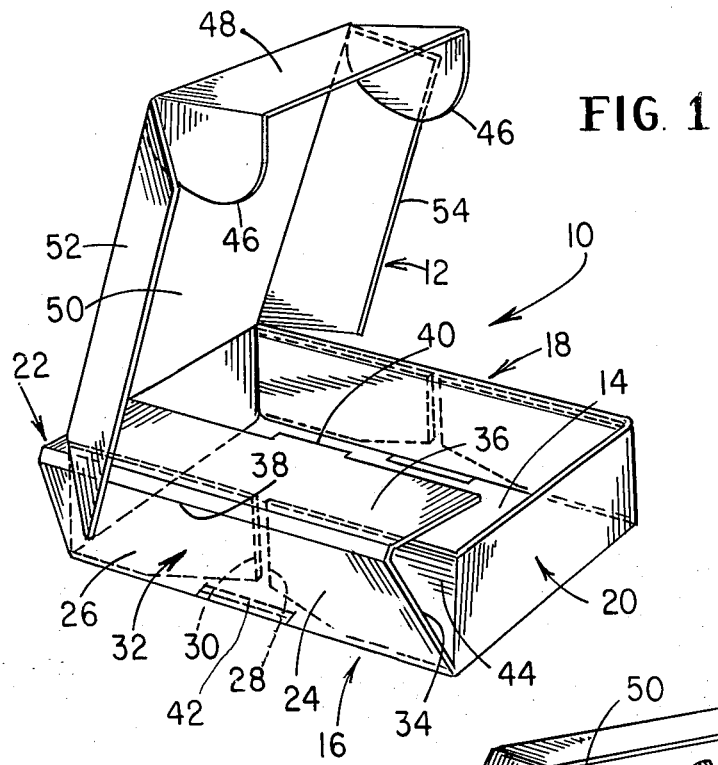
FIG. 1 is a perspective view illustrating a partially unassembled transportation container, with its cover in the open position, constructed according to the present invention.

Referring to the Figures, the transportation container of the present invention essentially comprises a box-like carton, generally indicated by reference numeral 10, of the type having a cover 12 movable between a first position exposing the interior of the carton and a second position forming with the remainder of the carton 10 a completely sealed structure. The carton 10 is also configured for suitably receiving for transportation therein items such as electronic components of various sizes. In this regard, the specific construction of the carton 10 illustrated in the drawings is intended to be of an exemplary nature only and not a limitation upon the invention. Thus, cartons of diverse other configurations which include a closeable top or cover and which are adapted for receiving for transportation items such as electronic components may be utilized in place of the carton illustrated in the drawings. Also, the carton 10 may be fabricated from a number of different materials including corrugated cardboard, plastic, hard board or even paper.

Referring to FIG. 1, the carton 10, whose construction is described in detail in the previously mentioned Mykleby patent, further comprises a generally planar bottom portion 14 circumscribed by a pair of opposed upstanding side walls 16 and 18 and a pair of opposed upstanding end walls 20 and 22. Each of the side walls 16 and 18 comprises a first intermediate portion 24 extending continuously from and transversely of end wall 20 and a second intermediate portion 26 extending continuously from and transversely of end wall 22, the intermediate portions 24 and 26 being configured such that their free edges 28 and 30 are in abutment with each other. Each of the side walls 16 and 18 further includes a portion 32 extending upwardly and continuously from the bottom portion 14. The portion 32 is formed for sandwiching intermediate portions 24 and 26 and, to this end, includes a pair of plates 34 and 36 connected by a ridge or shoulder 38. Each of the plates 36 includes a tab 40 receivable within a suitably configured slot 42 for securing the structure.

It will be observed that, when assembled, each of the side walls 16 and 18 forms a tab receiving space 44 between the inner surface of plate 34 and the exterior surface of intermediate portion 24. The tab receiving spaces 44 are each adapted for receiving a tab 46 formed at the distal ends of a front flap 48 of cover 12. Cover 12 which is connected in hinged relation to side wall 22 further comprises a generally planar top portion 50 from which front flap 48 extends in folding relation. Finally, a pair of side flaps 52 and 54 are formed in folded relation from top portion 50.

In use, the carton 10 is initially assembled by sandwiching the intermediate portions 24 and 26 of the side walls 16 and 18 between the plates of portion 32 with tabs 40 being received in slots 42. An item to be transported is then placed within the carton and the cover 12 is swung downwardly with tabs 46 being received within tab receiving spaces 44, side flaps 52 and 54 abuting the interior surfaces of plates 36 and front flap 48 overlying end wall 20.

Figure 2:
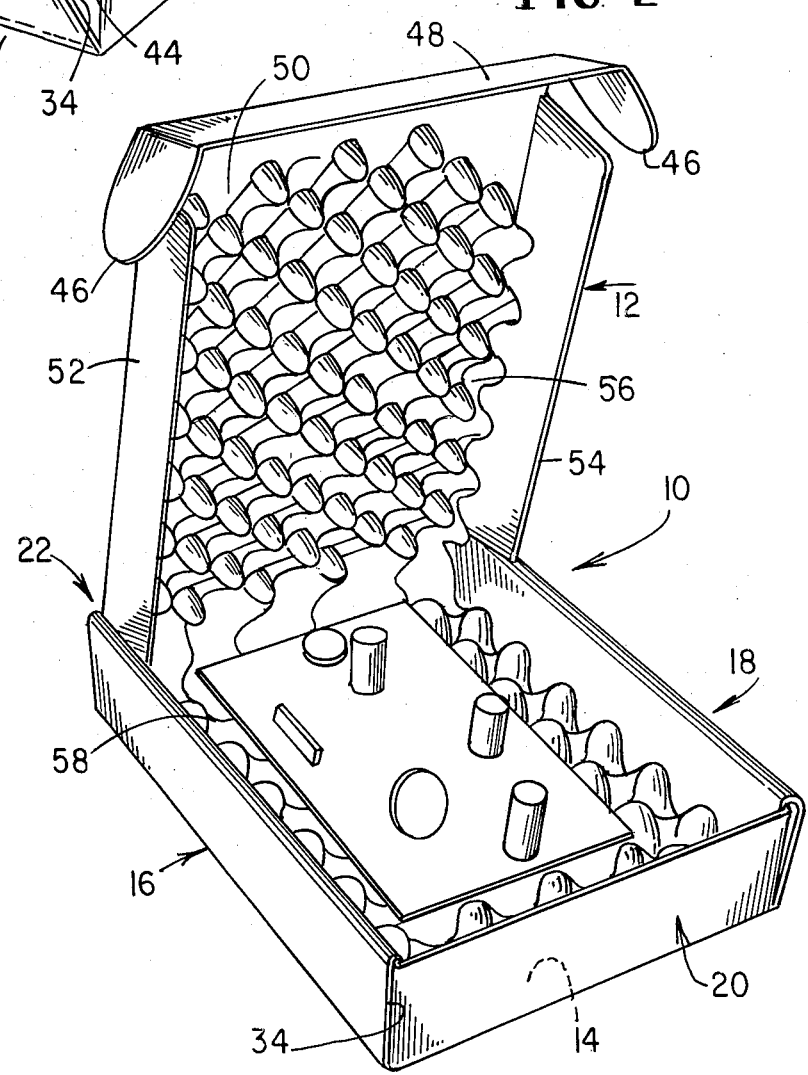
FIG. 2 is a perspective view illustrating the transportation container of FIG. 1 in its fully assembled form.

Referring now to FIG. 2, the interior surfaces of the top portion 50 of cover 12 as well as bottom portion 14 are each provided with a liner 56, 58 of convoluted urethane foam. Each of the liners 56 and 58, which may be secured by using a suitable adhesive, comprises a plurality of staggered foam fingers projecting into the interior space of the carton 10. Thus, when the cover 12 is moved to its closed position, an item placed within the carton 10 is gently sandwiched between the foam liners 56 ad 58 which thereby protect the items from physical shock during transportation.

The construction of carton 10 as described above is thus far largely conventional. According to the present invention, this configuration is advantageously utilized to form a Faraday cage type closure for protecting transported electronic components from deleterious electrostatic influences.

More specifically, in the process of fabricating the carton 10, or a container of generally similar construction, a coating of conductive material is initally applied to the exterior as well as to the interior surfaces of the carton. Preferably, the coating is substantially continuous from the exterior to the interior surfaces of the carton such that a double layer equipotential shield is formed completely encompassing the container. This equipotential shield is highly effective for protecting an electronic component transported within the carton 10 from externally generated electrostatic influences such as the electromagnetic radiation eminating from a wide variety of known sources.

With further reference to FIG. 2, the coating is applied to the exterior surfaces of the carton 10 by spraying or brushing the conductive material on the exterior surfaces of plates 30 of side walls 16 and 18, the exterior surfaces of end walls 20 and 22 and the exterior surface of bottom portion 14. In addition, the exterior surfaces of front flap 48 and top portion 50 of cover 12 are also coated with the conductive material. The coating is applied to the interior of carton 10 by applying the conductive material to the inwardly facing surfaces of the plates 36 of the side walls 16 and 18, the interior surfaces of end walls 20 and 22, the interior surface of bottom portion 14 and the interior surface of top portion 50 of cover 12. As mentioned above, the coating is applied in a continuous manner so as to form a continuous conductive path between the portion of the coating applied to the interior and exterior surfaces of the container.

The application of the coating to the container 10 as described above should only be considered as exemplary of one particular method in which the coating may be applied. Thus, depending upon the integrity of the resulting equipotential shield desired, more or fewer surfaces of the carton parts may be coated with the conductive material. The essential requirements discussed above, however, remain the same; namely, that a substantial portion of the interior and exterior surfaces are coated and that the coating be continuous between such surfaces.

The conductive material used to form the coating may take a variety of forms. For example, a solution comprising carbon and graphite of the type used for coating color picture tubes has been found to perform quite adequately. However, in general, any conductive chemical supplied in a base such as epoxy may be utilized for this purpose.

According to the invention, the characteristics of the Faraday cage formed by the conductive coating are further enhanced by impregnating the foam liners 56 and 58 with the conductive material. This may be accomplished by quench dunking the foam liners into a suitable vat of the conductive material prior to adhering the liners to the carton 10. The impregnated foam liners thereby form a continuous conductive path with the conductive coating and actually become part of the equipotential surface defining the Faraday cage. The impregnated foam, which intimately contacts the transported components when the carton 10 is closed, promotes the rapid discharge of static electricity from the components when the carton is brought into contact with a ground potential.

What has thus been shown is an improved Faraday cage type shipping container for use with electrostatic sensitive electronic components, which container provides an environment for the electronic components which is largely immune from external electrostatic influences and which promotes the rapid discharge of static electricity accummulated by the components.

While a particular embodiment of the present invention has been shown and described, it will be obvious to those skilled in the art that various changes and modifications may be made without departing from the invention in its broader aspects. The aim of the appended claims, therefore, is to cover all such changes and modifications as fall within the true spirit and scope of the invention.

What is claimed is:
1. A container for use with electrostatic sensitive electronic components comprising:
a box-like structure having a bottom, a pair of opposed side walls, a pair of opposed end walls and a top movable between a first position exposing the interior of said box-like structure and a second position enclosing said box-like structure;

a continuous conductive coating formed overlying substantially all of the exterior and interior surfaces of said box-like structure; and a liner of convoluted foam impregnated with a conductive material secured to the interior surfaces of said top and bottom for promoting intimate contact with an article contained within said box-like structure, said conductive material forming a continuous conductive path with said conductive coating, whereby a continuous conductive path is established between the exterior surface of said box-like structure and an article contained therein.

2. A container according to claim 1 wherein said conductive coating and said conductive material comprises a solution of carbon and graphite.

* * * * *

UNITED STATES PATENT OFFICE
CERTIFICATE OF CORRECTION

Patent No. 4,241,829          Dated December 30, 1980

Inventor(s) Charles T. Hardy

It is certified that error appears in the above-identified patent and that said Letters Patent are hereby corrected as shown below:

Column 2, Line 16 should read as follows:

tween. A liner of convoluted foam impregnated with a

Signed and Sealed this

Thirty-first Day of March 1981

[SEAL]

Attest:

RENE D. TEGTMEYER

Attesting Officer      Acting Commissioner of Patents and Trademarks